United States Patent [19]
Ahern et al.

[11] Patent Number: 5,252,366
[45] Date of Patent: Oct. 12, 1993

[54] CHEMICAL VAPOR DEPOSITION METHOD USING AN ACTIVELY COOLED EFFUSER TO COAT A SUBSTRATE HAVING A HEATED SURFACE LAYER

[75] Inventors: Brian S. Ahern, Boxboro; David W. Weyburne, Maynard, both of Mass.

[73] Assignee: The United States of America as represented by the Secretary of the Air Force, Washington, D.C.

[21] Appl. No.: 991,502

[22] Filed: Dec. 16, 1992

Related U.S. Application Data

[60] Continuation of Ser. No. 797,478, Nov. 22, 1991, abandoned, which is a division of Ser. No. 469,128, Jan. 24, 1990, Pat. No. 5,129,360.

[51] Int. Cl.$^5$ ............................................. C23C 16/46
[52] U.S. Cl. .................................. 427/557; 427/255.2; 427/255.5; 427/255.7; 427/573; 427/585; 118/719; 118/724; 118/725
[58] Field of Search ................. 427/255.5, 573, 585, 427/557, 255.2, 255.7; 118/719, 723 R, 724, 725

[56] References Cited

U.S. PATENT DOCUMENTS

| | | | |
|---|---|---|---|
| 4,625,678 | 12/1986 | Shioya et al. | 118/725 |
| 4,736,705 | 4/1988 | Weyburne | 118/725 |
| 4,854,263 | 8/1989 | Chang et al. | 118/725 |
| 4,913,090 | 4/1990 | Harada et al. | 118/725 |
| 5,000,113 | 3/1991 | Wang et al. | 118/715 |

FOREIGN PATENT DOCUMENTS

| | | | |
|---|---|---|---|
| 59-79519 | 5/1984 | Japan | 118/719 |
| 62-89322 | 4/1987 | Japan | 118/719 |
| 63-119523 | 5/1988 | Japan | 118/725 |
| 63-177526 | 7/1988 | Japan | 118/724 |
| 1-115118 | 5/1989 | Japan | 118/724 |
| 1-286318 | 11/1989 | Japan | 118/725 |

Primary Examiner—Terry J. Owens
Attorney, Agent, or Firm—Stanton E. Collier; Donald J. Singer

[57] ABSTRACT

An actively cooled effuser for a vapor deposition reactor is placed in very close proximity to a substrate. The actively cooled effuser has combinations of gas directing plates, cooling plates and isolation plates attached together. Reactants and coolant are input into the stack of plates so formed. Selective heating of the substrate surface may occur through the use of heating lamps. Multiple units of the actively cooled effuser and heating lamps may be used in the reactor to form multiple layers on the substrate. The cooling plate has a cooling channel within a few thousandths of an inch of the output side of the stack. The presence of the cooling plates allows the effuser to be placed in very close proximity to the selectively heated substrate.

3 Claims, 2 Drawing Sheets

CHEMICAL VAPOR DEPOSITION METHOD USING AN ACTIVELY COOLED EFFUSER TO COAT A SUBSTRATE HAVING A HEATED SURFACE LAYER

STATEMENT OF GOVERNMENT INTEREST

The invention described herein may be manufactured and used by or for the Government for governmental purposes without the payment of any royalty thereon.

This application is a continuation of application Ser. No. 07/797,478, filed 22 Nov. 1991, now abandoned, which is a division of application Ser. No. 07/469,128, filed 24 Jan. 1990, now U.S. Pat. No. 5,129,360.

BACKGROUND OF THE INVENTION

The present invention relates to chemical vapor deposition, and, in particular, relates to apparatus of applying the chemicals to the substrate in question.

Chemical vapor deposition (CVD) is one of the methods of growing epitaxial layers on a substrate material.

In one prior CVD apparatus, the gaseous reactants are introduced into a quartz tube reactor vessel in which a substrate is held by a substrate holder and a susceptor. The susceptor is heated so that the reactants pyrolyze and deposit out onto the heated substrate thereon. The CVD apparatus includes a vapor delivery apparatus having the desired gas input into a series of stacked flat plates positioned about a slotted gas pipe or rod. The stacked plates surround the slotted gas rod and form a series of flat flow channels to deliver the gas. The type of gas input can be changed by valving into the vapor delivery apparatus. Because of the distance between the heated substrate and the vapor delivery apparatus, spent gas may recirculate affecting thickness and compositional uniformity so that graded layer transistions occur when changing gas types. This results in a poor or inoperative semiconductor structure.

One method of eliminating spent gases is to inject inert gases to clean the reactor vessel but thermal degradation of prior deposited layers can occur while the inert gas is flushing the reactor vessel. The thermal degradation of exposed surfaces of epitaxial layers also results in degraded crystal structures.

Another problem of prior apparatus is the premature mixing or pre-reaction of the reactants before they reach the substrate.

A further problem with prior CVD reactors is non-uniform crystal layer growth due to variations in the reactant gases. Prior solutions to this problem have been a long entrance length and/or inserts that help produce non-turbulent flow.

Another problem with prior CVD reactors is that only a small portion of the reactants actually deposit on the substrate so that one must collect and dispose of the spent reactant gases which are typically toxic.

Other problems with prior apparatus involve heating the substrate for proper chemical bonding where the reactant gases react. Several methods have been used including resistive, infrared, inductive or convective heating. When the whole substrate is heated, uniformity of heating has been a problem.

These problems clearly affect the ability to produce high quality semiconductor components such as high electron mobility transistors and multi-quantum well laser diodes since they require extremely sharp heterojunctions between dissimilar layers of semiconductor crystals.

When heterojunctions are not sufficiently abrupt, grading and other defects occur which decrease component performance, reliability and life. Creating abrupt heterojunctions is a difficult requirement to consistently fulfill because many sophisticated heterojunction structures require abruptly switching of material in ten to twenty angstrom thick layers.

SUMMARY OF THE INVENTION

The present invention comprises a CVD reactor having at least one actively cooled effuser with appropriate piping and valving, etc., a substrate transporting means, a selective heating means, and other features to be detailed.

The actively cooled effuser has a plurality of gas directing plates and a plurality of interleaved cooling plates. The gas directing plates have an output side with an orifice therein. The cooling plates have a cooling side with a cooling channel in close proximity thereto. When the plates are interleaved the cooling side and the output side are adjacent and in approximately the same plane. Appropriate piping and valving introduces the reactants and the coolant into the actively cooled effuser. Additionally, isolation plates may be placed between gas directing plates where a subsequent gas follows the first. As a direct result of the cooling plates, the substrate is transported within a few millimeters of the actively cooled effuser. The heating means may be a heat lamp selectively focused to heat the areas of the substrate where the reactants are directed rather than the whole substrate.

An additional feature is an electric field between the actively cooled effuser and the substrate to produce a plasma therebetween.

It is therefore one object of the present invention to provide a CVD reactor having an actively cooled effuser wherein the substrate may be positioned in close proximity thereto for deposition to prevent gas recirculation.

Another object of the present invention is to provide a CVD reactor that prevents pre-reaction of the gases.

Another object of the present invention is to provide a CVD reactor containing selective heating means to eliminate bulk heating of the substrate.

Another object of the present invention is to provide a CVD reactor able to produce high quality semiconductor structures having thin layers and abrupt interfaces on multiple substrates in a single CVD reactor.

Another object of the present invention is to provide a CVD reactor that utilizes substantially less reactants.

And another object of the present invention is to provide a CVD reactor constructed out of metal rather than glass.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

Figure 1:
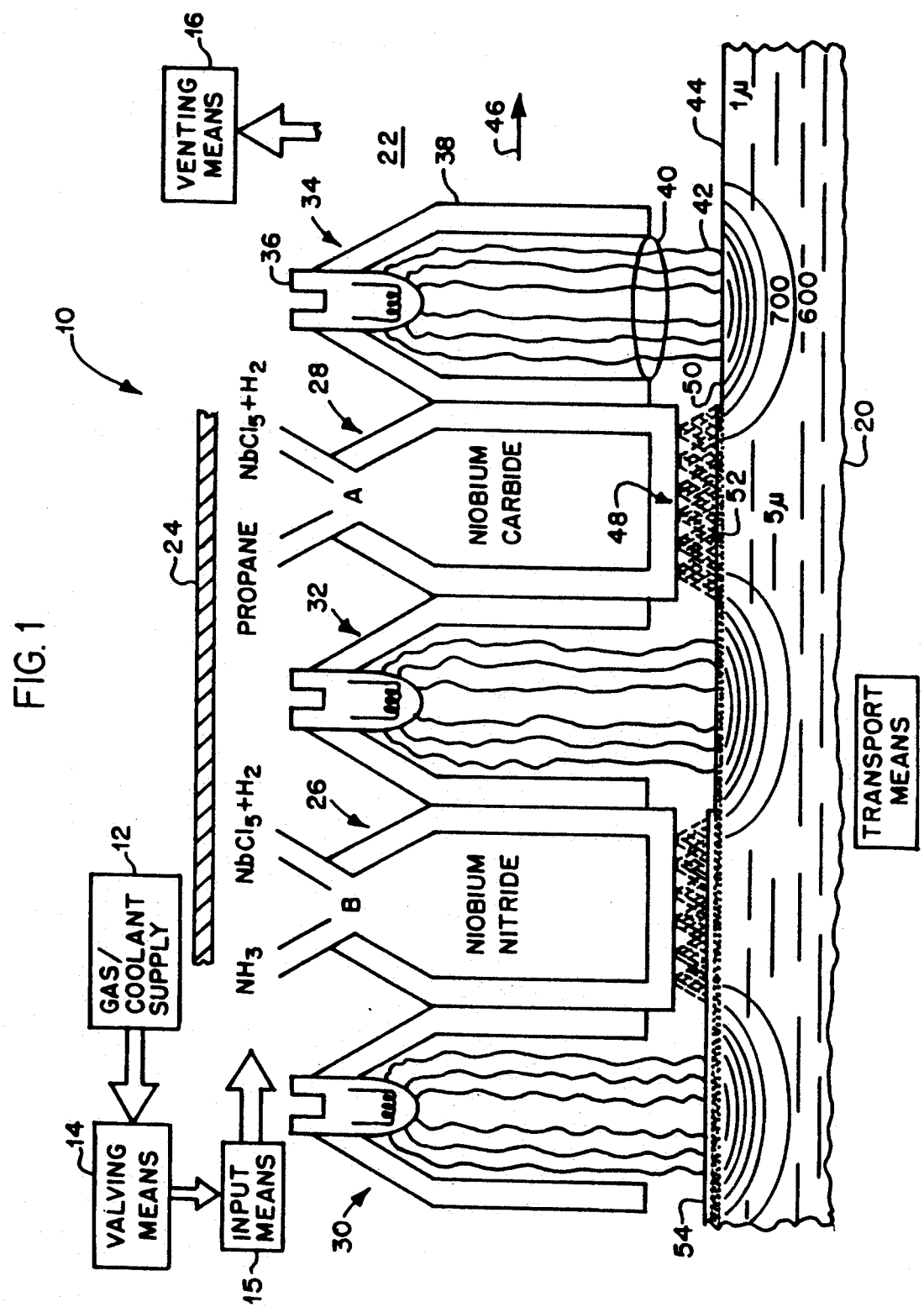
FIG. 1 illustrates a CVD reactor having a plurality of effusers with heating lamps.

Referring to FIG. 1, a chemical vapor deposition (CVD) reactor 10 is partially shown. The CVD reactor 10 includes a gas/coolant supply 12, valving means 14, input means 15, venting means 16, and transporting means 18 having at least one substrate 20 thereon. A reaction chamber 22 being enclosed by a metal wall 24, shown partially, has therein two actively cooled effusers 26 and 28 with heating means 30, 32 and 34 for depositing on the substrate 20 a layer of niobium carbide followed by a layer of niobium nitride. Other types and numbers of layers are clearly possible as well as the number of heating means and effusers The substrate 20 is moving to the right as is indicated by arrow 46. This embodiment is only considered to be illustrative of the apparatus and the technique involved.

As the substrate 20 is transported to the left, heating means 34 being a heating lamp 36 in a housing 38 with an optional focusing means 40 causes light energy 42 to fall upon the substrate 20 and heat it to a required reaction temperature at a surface 44 of the substrate 20. First reactants 48 are emitted from the actively cooled effuser 28 onto the heated surface 50. Since the reactants are deposited only on the surface, heating is only selectively required at this location and only to a depth of about 5 microns or so. The actively cooled effuser is positioned within 10 millimeters of the surface 44 thus reducing recirculation of spent gases and pre-reaction of the gases.

The subsequent heating means 32 and the actively cooled effuser 26 deposit a second layer 54 on a first layer 52.

The reactants supplied by the gas supply 12 are directed through the valving means 14 to the appropriate actively cooled effuser. The venting means 16 removes the spent reactants from the reaction chamber 22.

The transporting means 18 may be either a rotary table or a linearly moving table with either single or multiple substrates thereon. Further, the transporting means 18 may alternatively move the actively cooled effusers and heating means.

Figure 2:
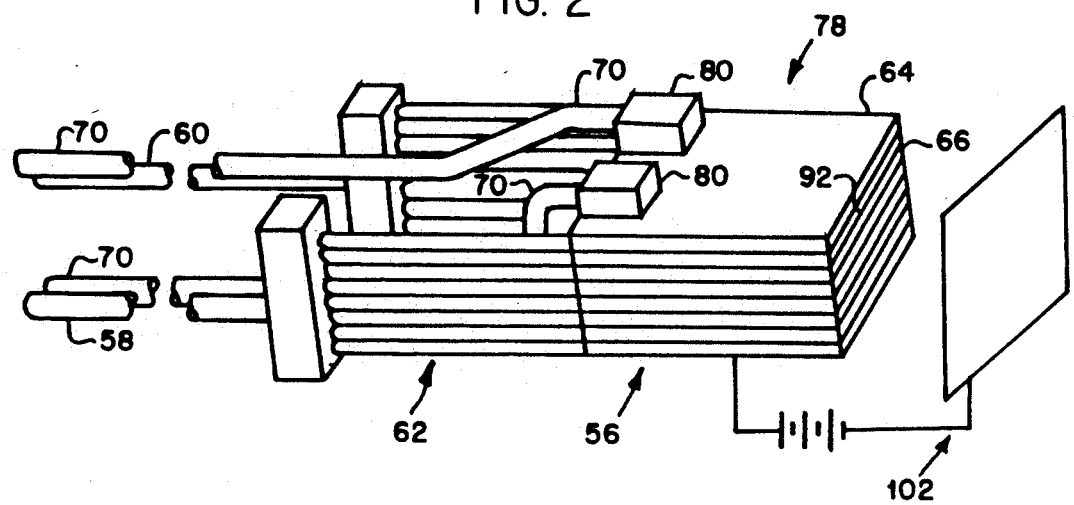
FIG. 2 illustrates by view a single actively cooled effuser.

Referring to FIG. 2, a single actively cooled effuser 56 is shown.

The effuser 56 has a coolant input 58 and a coolant output 60 feeding into and out of a coolant manifold 62. The coolant manifold 62 is further connected to a number of cooling plates 64, FIG. 4, which are interleaved with gas directing plates 66, FIG. 3A or 3D. If multiple gas directing plates 66 are grouped between coolant plates 64, isolation plates 68, FIG. 3B, may be used to separate these.

As to the gas directing plates 66 and the isolation plates 68 reference is made to U.S. Pat. No. 4,736,705 which is incorporated by reference.

Figure 3A:
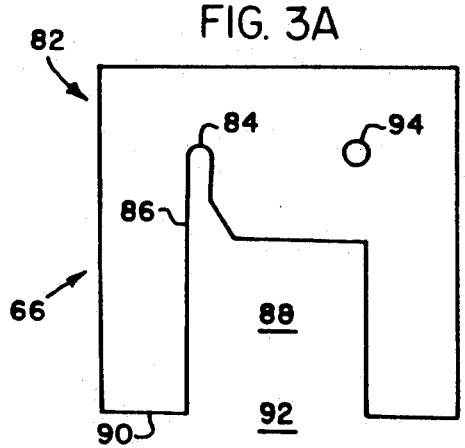
FIG. 3A illustrates by side view a single gas directing plate.
Figure 3B:
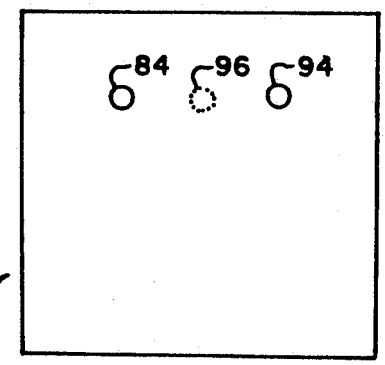
FIG. 3B illustrates by side view an isolation plate.
Figure 3C:
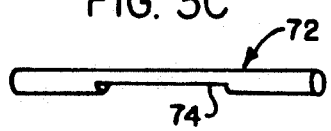
FIG. 3C illustrates a slotted feed rod.

Referring back to FIG. 2, gas inputs 70 are connected to a pair of slotted feed rods 72, such as shown in FIG. 3C, having a longitudinal slot 74 therein. As the gas flows into rod 72, it exits through the slot 74 in accordance to the positioning of the gas directing plates 66.

Figure 3D:
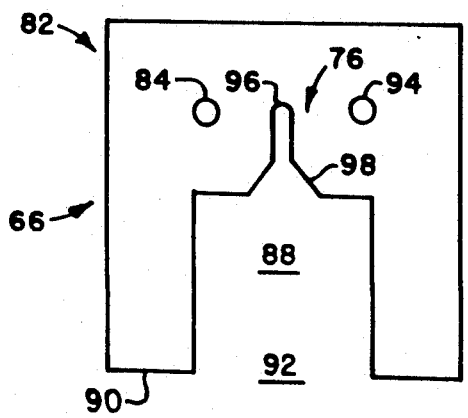
FIG. 3D illustrates a gas directing plate with a center feed.

Referring to FIG. 3A, the gas directing plate 66 shown has two gas inputs. The dotted lines indicate the structure when a third gas input 76, FIG. 3D, is included. A third rod 72 is inserted into the hole 96.

In order to assemble plate stack 78, FIG. 2, two slotted feed rods 72 are inserted into coupling blocks 80. The coupling blocks 80 are attached to the cooling plate 64. Nextly, the gas directing plate 66 is placed over the rods 72 and next to the cooling plate 64. Then another cooling plate 64 is placed on rods 72 and next to the gas directing plate 66.

Again referring to FIG. 3A, the gas directing plate 66 shown is considered a "left rod plate" 82 since the rod 72 passes through a hole 84 with a flow channel 86 fluidly connected thereto and flow channel 86 is fluidly connected to a gas directing section 88. As the gas flows into rod 72 it exits through the slot 74 into the flow channel 86 and then into the gas directing section 88 from there exiting through an output side 90 having an orifice 92 therein. The gas flowing in the right rod 72 through hole 94 is not able to enter gas directing section 88 because there is no flow channel at the section.

In order for the gas to exit from the right rod, gas directing plate 66 is flipped over when it is attached to the plate stack 78 to form a "right rod plate." Each gas directing plate 66 has either the cooling plate 64 and/or the isolation plate 68 on each side while in the plate stack 78.

A third feed rod 72 may be placed in a third hole 96, FIG. 3D. In order for the gas to flow from the third rod 72 only, only the center flow channel 98 can exist in that plate as shown.

As noted above each gas directing plate 66 has either the isolation plate 68 and/or the cooling plate 64 on both sides unless there is a desire to either pre-mix or pre-react the gases.

Figure 4:
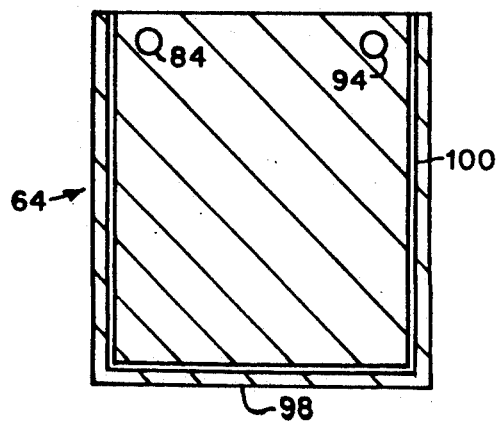
FIG. 4 illustrates by a cross section view a cooling plate.

The cooling plate 64 is shown in detail in FIG. 4. The holes 84 and 94 for the rods 72 pass directly through. A flow channel 100 connected to the coolant manifold 62 passes within a few thousandths of an inch to a cooling side 90. Even when the substrate surface 50 is within a distance of about 0.010 to 0.1 inches, the output side 90 of gas directing plates 66 should remain cool when the surface 50 is at about 800 degrees Centigrade. Reflecting material may be applied to the cooling side 98 to reduce the heating affect.

Another feature of the invention is a plasma producing means 102 shown in FIG. 2 wherein an DC or AC voltage is applied between plate stack 78 and the substrate 20. The close proximity of the plate stack 78 to the substrate 20 allows for modest voltages to create the required electric field to induce the plasma state.

Clearly, many modifications and variations of the present invention are possible in light of the above teachings and it is therefore understood, that within the inventive scope of the inventive concept, the invention may be practiced otherwise than specifically claimed.

What is claimed is:

1. A process of vapor deposition, said process having a vapor deposition reactor with an actively cooled effuser, said process comprising the steps of:

heating only a surface layer of a substrate to a temperature at which a deposition material reacts to form a layer thereon, said heating being applied to an area of the surface layer where the deposition material is to be applied, said heating not being of the whole substrate;

transporting said surface layer after said heating past said actively cooled effuser, said surface layer being positioned within a distance from said actively cooled effuser, said actively cooled effuser having at least one gas directing plate therein for outputting at least one deposition material onto said heated surface layer;

depositing by way of said at least one gas directing plate a layer of said at least one deposition material onto the heated surface layer of said substrate;

cooling said actively cooled effuser to remove heat received from said substrate, said cooling being provided by flow channels placed less than about 100 microns from an output side of said at least one gas directing plate; and repeating the above steps to place additional layers of said at least one deposition material onto said substrate.

2. A process of vapor deposition, said process having a vapor deposition reactor with an actively cooled effuser, said process comprising the steps of:

heating only a surface layer of a substrate to a temperature at which a deposition material reacts to form a layer thereon, said heating being applied to an area of the surface layer where the deposition material is to be applied, said heating not being of the whole substrate;

transporting said surface layer after said heating past said actively cooled effuser, said surface layer being positioned within a distance from said actively cooled effuser, said actively cooled effuser having at least one gas directing plate therein for outputting at least one deposition material onto said heated surface layer;

depositing by way of said at least one gas directing plate a layer of said at least one deposition material onto the heated surface layer of said substrate, said heated surface layer being about 5 microns deep;

cooling said actively cooled effuser to remove heat received from said substrate, said cooling being provided by flow channels placed less than about 100 microns from an output side or said at least one gas directing plate; and repeating the above steps to place additional layers of said at least one deposition material onto said substrate.

3. A process of vapor deposition, said process having a vapor deposition reactor with an actively cooled effuser, said process comprising the steps of:

heating only a surface layer of a substrate to a temperature at which a deposition material reacts to form a layer thereon, said heating being applied to an area of the surface layer where the deposition material is to be applied, said heating not being of the whole substrate;

transporting said surface layer after said heating past said actively cooled effuser, said surface layer being positioned within a distance from said actively cooled effuser, said distance being from 2 to 10 millimeters, said actively cooled effuser having at least one gas directing plate therein for outputting at least one deposition material onto said heated surface layer;

depositing by way of said at least one gas directing plate a layer of said at least one deposition material onto the heated surface layer of said substrate;

cooling said actively cooled effuser to remove heat received from said substrate, said cooling being provided by flow channels placed less than about 100 microns from an output side of said at least one gas directing plate; and repeating the above steps to place additional layers of said at least one deposition material onto said substrate.

* * * * *